United States Patent [19]

Lou

[11] Patent Number: 5,338,990
[45] Date of Patent: Aug. 16, 1994

[54] REGULATED DELAY LINE
[75] Inventor: Perry W. Lou, Carlsbad, Calif.
[73] Assignee: Brooktree Corporation, San Diego, Calif.
[21] Appl. No.: 19,784
[22] Filed: Feb. 19, 1993

Related U.S. Application Data

[63] Continuation of Ser. No. 717,004, Jun. 18, 1991, abandoned.

[51] Int. Cl.[5] .................... H03K 5/159; H03K 3/01
[52] U.S. Cl. .................... 307/603; 307/262; 307/269; 328/55; 328/155; 328/63
[58] Field of Search .................... 328/55, 155, 63; 307/262, 269, 603

[56] References Cited

U.S. PATENT DOCUMENTS 4,922,141  5/1990  Lofgren et al. .................... 328/155
4,985,639  1/1991  Renfrow et al. .................... 307/603

Primary Examiner—Timothy P. Callahan
Attorney, Agent, or Firm—Ellsworth R. Roston; Charles H. Schwartz

[57] ABSTRACT

Three delay lines may have common characteristics. The first delay line delays the rising edge of an input signal and a first inverter inverts this signal to provide a falling edge. A second inverter inverts the rising edge of the input signal to produce a falling edge which is introduced to the second delay line in a second path with the second inverter. The signals from the two paths may be introduced to a comparator which produces a control signal having logic levels dependent upon the relative times that the falling edges occur for the signals in the two paths. For example, the control signal may have the first logic level when the falling edge occurs first in the first path and the control signal may have the second logic level when the falling edge occurs first in the second path. The voltage from a charge pump is adjusted in accordance with the logic level of the control signal. This voltage is introduced to the first and second delay lines to adjust their delay to minimize the time difference in the falling edges of the signals from these lines. This voltage is also introduced to the third delay line to adjust its delay in accordance with the adjustments in the delays in the first and second lines. In this way, the third delay line provides the same time for rising edges and falling edges in data signals introduced to the line.

9 Claims, 1 Drawing Sheet

REGULATED DELAY LINE

This is a continuation of application Ser. No. 07/717,004 filed Jun. 18, 1991, now abandoned.

This invention relates to delay lines and more particularly to a system for providing the same time delay for rising edges and falling edges in signals introduced to the delay line. The invention is especially adapted to be used with integrated delay lines receiving digital signals.

In digital circuitry, the propagation delays in a delay line for signals having rising characteristics are generally different from the propagation delays for signals having falling characteristics. This results from differences in the active components in the circuitry and also possibly from the propagation of the signals with the rising characteristics in different paths from the propagation of the signals with the falling characteristics. However, in an ideal delay line, it is desirable to have the same delay in the rising edge of a signal as in the falling edge of the signal regardless of the data being propagated and regardless of the delay provided by the delay line. Such a delay line may be considered to provide "delay symmetry".

Prior attempts in providing "delay symmetry" in a delay line have been non-adaptive. In other words, by a careful design of electrical circuitry or by a careful layout of electrical circuitry on an integrated circuit chip or by a one-time adjustment such as the laser trim of circuitry on an integrated circuit some degree of delay symmetry has been attained. However, this delay circuitry has been attained by these methods only at some unique condition such as nominal processing of a particular voltage at a particular temperature.

An example of the design approach specified in the previous paragraph is to cascade paired, identical, inverting delay lines each of which has asymmetrical delays. To achieve net symmetrical delays in the paired delay lines, attempts have been made to match output loads to the output and input characteristics of the delay lines. In these attempts, careful attention has had to be paid to ensure that each of the delay lines receives substantially the same input source characteristics and output loading as the other delay line. For simplicity, the delay lines have generally received a non-adjustable voltage to control delay so that the circuitry including the delay lines has provided no adjustable means for compensating for asymmetry. The circuitry described in this paragraph has been particularly employed in ring oscillators for producing output signals with a fifty percent (50%) duty cycle.

In another example in the prior art, CMOS inverters of the n and p type have been converted into delay elements by inserting current sources in series with the inverters to constrain the operation of the inverters. The current sources have been set, typically by current mirroring techniques, to provide matched values in an attempt to provide delay symmetry in the inverters. However, the results are strongly dependent upon the layout of the circuitry on an integrated circuit chip and upon the threshold of the gates in the current sources. These gate thresholds become somewhat indeterminate because of the characteristics of the current sources, thereby limiting the ability of the circuitry to provide delay symmetry.

This invention provides a system for providing delay symmetry. In one embodiment of the invention, three delay lines may have common characteristics. The first delay line delays the rising edge of an input signal and a first inverter in the same path as the first line inverts this signal to provide a falling edge. A second inverter inverts the rising edge of the input signal to produce a falling edge which is introduced to the second delay line in a second path with the second inverter.

The signals from the two paths may be introduced to a comparator which produces a control signal having logic levels dependent upon the relative times that the falling edges occur for the signals in the two paths. For example, the control signal may have the first logic level when the falling edge occurs first in the first path and the control signal may have the second logic level when the falling edge occurs first in the second path.

The voltage from a charge pump is adjusted in accordance with the logic level of the control signal. This voltage is introduced to the first and second delay lines to adjust their delay to minimize the time difference in the falling edges of the signals from these lines. This voltage is also introduced to the third delay line to adjust its delay in accordance with the adjustments in the delays in the first and second lines. In this way, the third delay line provides the same time for rising edges and falling edges in data signals introduced to the line.

Figure 1:
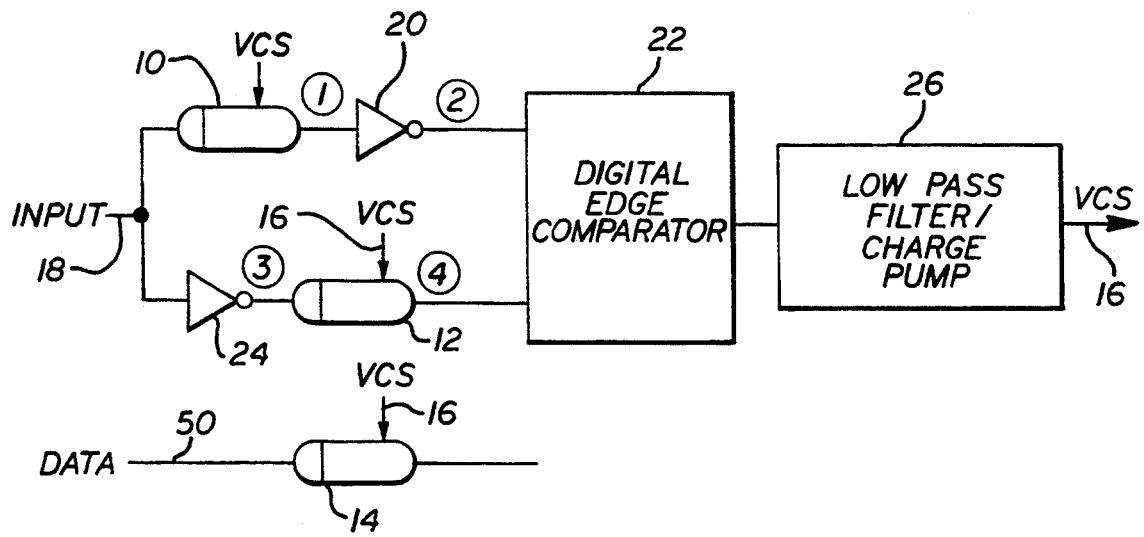
FIG. 1 is a circuit diagram of one embodiment of the invention.

In the embodiment shown in FIG. 1, three (3) delay lines 10, 12 and 14 are provided, all preferably with common characteristics. Each of the delay lines 10, 12 and 14 is adapted to provide a delay with variable characteristics dependent upon the characteristics of the voltage introduced to the delay line from an output line 16.

An input signal is introduced to the delay line 10 from an input line 18. The output from the delay line 10 passes to an inverter 20, the output of which is connected to a comparator 22. The input signal on the line 18 is also introduced to an inverter 24 which preferably has common characteristics with the inverter 20. The output from the inverter 24 is introduced to the delay line 12 and the output from the delay line is introduced to the comparator 22. The output from the comparator 22 is introduced to a charge pump 26 having characteristics of operating as a low pass filter. The control voltage on the line 16 is obtained from the operation of the charge pump 26.

Figure 2:
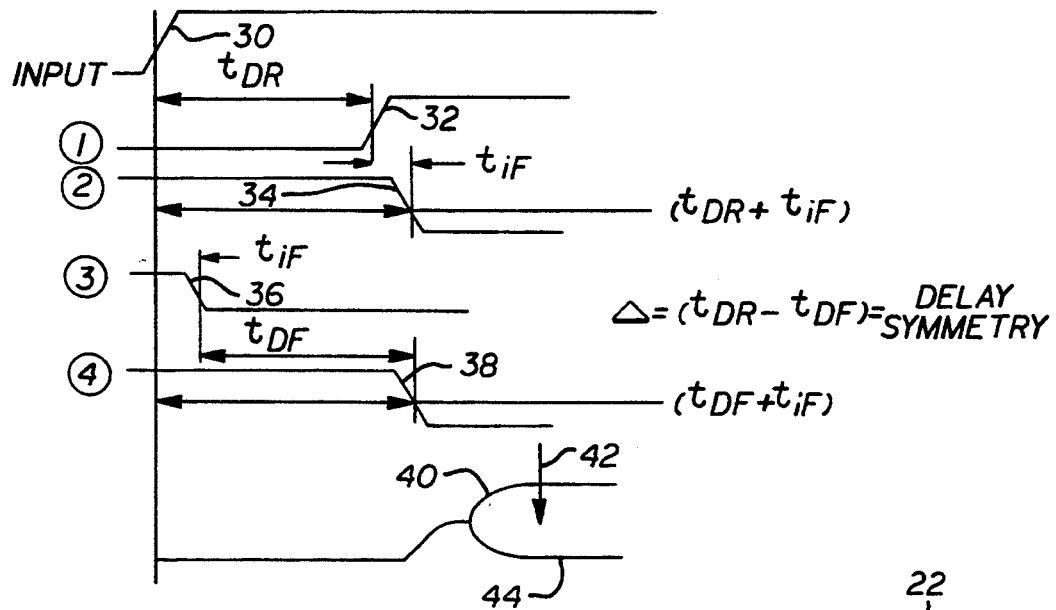
FIG. 2 illustrates voltage characteristics at strategic terminals in the circuitry shown in FIG. 1.

An input signal introduced to the input line 18 is illustrated at 30 in FIG. 2. This signal is delayed by the delay line 10 by a time tdr to produce a signal indicated at 32 in FIG. 2. The delayed signal 32 is then inverted by the inverter 20 as indicated at 34 in FIG. 2. As will be seen, the inverter 20 provides an additional delay tiF in the delayed signal 32 to produce the signal 34. This signal 34 is introduced to one input terminal of the comparator 22. As will be seen, the signal 34 has a falling edge whereas the input signal 30 has a rising edge.

The input signal 30 with the rising edge on the line 18 is also introduced to the inverter 24 which inverts the signal to produce a signal 36 with a falling edge. As will be seen, the falling edge of the signal 36 is delayed by a time tiF with respect to the rising edge of the signal 30.

The delay provided by the inverter 24 corresponds to the delay provided by the inverter 20 because the inverters 20 and 24 have common characteristics. The inverted signal 36 is delayed by the delay line 12 by a time tDF. The delayed signal is illustrated at 38 in FIG. 2 and is introduced to a second input terminal of the comparator 22.

As will be seen, the delay line 10 and the inverter 20 provide one path. The total delay of the input signal 30 in this path is tDR+tiF. Similarly, the inverter 24 and the delay line 12 provide a second path. The total delay of the input signal 30 in this path is tDF +tiF. Since the delay tiF in provided by the inverter in each of the two paths is the same as in the other path, any difference in the delay provided in the input signal 30 in the two paths is $$tDR+tiF-(tDF+tiF)=tDR-tDF \text{ where} \qquad (1)$$

tDR−tDF=the difference in the delay imparted to the input signal 30 in the two different paths.

The comparator 22 is constructed to provide a binary signal having a first logic level (representing a binary "1") when the falling edge of the signal 34 occurs before the falling edge of the signal 38. In like manner, the comparator 30 provides a signal having a second logic level (representing a binary "0") when the falling edge of the signal 38 occurs before the falling edge of the signal 34.

The binary signal from the comparator 22 is indicated at 40 in FIG. 2 when the binary signal has a logic level indicating a binary "1". This signal is sampled by the charge pump 26 at a particular time (indicated at 42 in FIG. 2) after the signal is produced on a steady state basis rather than on a transient basis. The sampled signal is introduced to the charge pump 26. The charge pump 26 acts in part as a low pass filter to introduce the output signal from the comparator 22 to the charge pump 26 at a low frequency.

When the output signal from the comparator 22 has a logic level representative of a binary "1", the magnitude of the output voltage VCS on the line 16 from the charge pump 26 is changed (e.g. increase in magnitude) in one direction. The magnitude of the output voltage VCS on the line 16 from the charge pump 26 is changed in an opposite direction (e.g. decrease in magnitude) when the output signal from the comparator 22 has a logic level (indicated at 44 in FIG. 2) representing a binary "0". The voltage VCS on the line 16 is introduced to the delay lines 10 and 12 to adjust the relative delays in these delay lines so that the difference in time between the time delay tDR in the first delay path and the time delay tDF in the second delay path will be minimized.

In this way, the rising and falling edges in each of the delay lines 10 and 12 are provided with delay symmetry. The voltage VCS on the line 16 is also introduced to the delay line 14 having common characteristics with the delay lines 10 and 12. As will be appreciated, the delay lines 10, 12 and 14 can be particularly provided with common characteristics when they are disposed on an integrated circuit chip. The delay line 14 receives data, preferably digital, at its input terminal from an input line 50. Since the delay line 14 receives the control voltage VCS, it provides a signal with symmetrical rising and falling edges in the same manner as discussed above for the delay lines 10 and 12. In this way, the delay line 14 delays data on the line 50 on a controlled basis to provide output data with symmetrical rising and falling edges.

Figure 3:
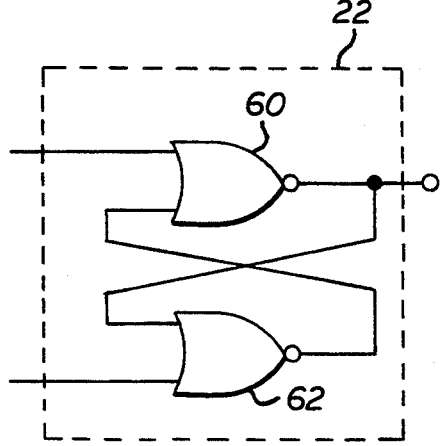
FIG. 3 illustrates the construction in additional detail of one of the stages included in the embodiment shown in FIG. 1.

FIG. 3 illustrates a circuit constituting one embodiment of the comparator 22 in the system shown in FIG. 1. The embodiment shown in FIG. 3 includes a pair of stages 60 and 62 preferably having common characteristics. Each of the stages includes a CMOS "OR" gate and an inverting amplifier to provide an "NCR" logic gate. The stage 60 has a first input terminal connected to the output of the inverter 20 in FIG. 1 and a second input terminal connected to the output of the inverter 62. A first input terminal of the stage 62 receives the output from the delay line 12 and a second input terminal of the stage 62 receives the output from the stage 60. The output of the stage 60 is introduced to the charge pump 26.

When the inverter 20 provides an output with a falling edge as indicated at 34 in FIG. 2 and the output of the inverter 62 is low, the "OR" gate in the stage 62 passes a signal which is inverted by the inverting amplifier in the stage to produce a voltage of high amplitude. This voltage is sampled and the sampled voltage is introduced to the charge pump 26 to provide a change in one direction in the magnitude of the voltage VCS from the charge pump.

The voltage of high amplitude on the output from the stage 60 is introduced to one of the inputs to the "OR" gate in the stage 62. This causes the "OR" gate in the stage 62 to pass a signal. This signal is inverted by the amplifier in the stage 62 such that a voltage of low amplitude is produced by the stage. At the same time, the stage 60 produces a voltage of high amplitude on its output terminal.

It may sometimes happen that the falling edge of the signal in the delay line 12 occurs before the falling edge of the signal from the inverter 20. At such times, a high voltage is produced on the output of the stage 62 and a low voltage is produced on the output of the stage 60. The low voltage on the output of the stage 60 is sampled and this sampled voltage is introduced to the charge pump 26 to obtain a change in the magnitude of the voltage VCS from the charge pump in an opposite direction to that discussed previously.

The apparatus described above has certain important advantages. It provides a servo system for directly measuring the effects of a delay line on an input signal and for controlling these time effects to provide a signal with symmetrical rising and falling characteristics. It provides this control on a digital rather than an analog basis. Furthermore, the servo control is provided by two parallel paths each having the same input impedance and output loading as the other. However, such constraints are not provided for the delay line 14, which responds to the digital data to be processed. As a result, the delay line 14 is free to face optimally with any components or stages associated with the delay line.

There are other advantages obtained from the system of this invention. For example, the delay lines 10 and 12 are not constrained to be either inverting or non-inverting. Furthermore, the system does not require any configuration or layout matching between the path providing rising edge delay and the falling edge delay in any delay line. Rather, in this invention, symmetry between the rising and falling edges in the signal in the delay line 14 is obtained by adjusting the delay tDR in the path including the delay line 10 and the delay tDF in the path including the delay line 12 so that these delays are equal.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for use with input data having rising edges and falling edges to provide a symmetrical delay between the rising and falling edges, a first delay line, first means for providing an input signal having first and second logic levels, second means including the first delay line for introducing the input signal to the first delay line for delay by the delay line and for then providing a first signal with the second logic level from the second means when the input signal has the first logic level, a second delay line, third means including the second delay line for introducing the input signal to the second means to provide a second signal with the second logic level when the input signal has the first logic level and for then providing a delay of the second signal with the second logic level by the second delay line, fourth means responsive to the respective production by the second and third means of the first and second delayed signals with the second logic level for producing a control signal indicating the relative times of production of such first and second delayed signals with the second logic level by the second and third means, and fifth means responsive to the control signal from the fourth means for providing respective adjustments by the second means and the third means in the delays in the first and second delay lines to minimize any difference between the relative times of production by the second and third means of the first and second delayed signals with the second logic level.

2. In a combination as set forth in claim 1 wherein the fourth means produces the control signal with a first logic level when the second means produces the first delayed signal with the second logic level before the production of the second delayed signal with the second logic level by the third means and the fourth means produces the control signal with a second logic level when the third means produces the second delayed signal with the second logic level before the production of the first delayed signal with the second logic level by the second means and wherein the fifth means provides respective adjustments by the second means and the third means in the delays in the first and second delay lines to the input signal in accordance with the first and second logic levels of the control signal from the fourth means.

3. In a combination as set forth in claim 1 wherein the first and second delay lines have common characteristics, and the fifth means introduces the control signal to the second means and the third means to provide respective adjustments in the delays in the first and second delay lines in accordance with the characteristics of such control signal.

4. In a combination as set forth in claim 3 wherein the first means introduces the input signal to the second and third means and the second means delays the input signal in the first delay line and inverts the input signal after such delay and the third means inverts the input signal and then delay the inverted input signal in the second delay line after such inversion.

5. In combination for use with data having rising and falling edges to provide a symmetrical delay between the rising and falling edges in such data, a first variable delay line, a second variable delay line, first means for providing an input signal having a rising edge to provide the input signal with a first logic level and having a falling edge to provide the input signal with a second logic level, second means including the first variable delay line for initially inverting the input signal and then delaying the inverted input signal to provide a first signal with the second logic level, after a period of time dependent upon the delay in the first variable delay line, from the time that the input signal has the first logic level, third means including the second variable delay line for initially delaying the input signal and then inverting the delayed input signal to provide a second signal with the second logic level after a period of time dependent upon the delay in the second variable delay line, from the time that the input signal has the first logic level, and fourth means responsive to the relative times in the production of the second logic level in the first and second signals in the second means and the third means for providing respective adjustments in the response of the to obtain the second logic level in the input signal in the second means and the third means to occur at substantially the same time after the input signal has the first logic level.

6. In a combination as set forth in claim 5 wherein the first and second variable delay lines have common characteristics and wherein the fourth means introduces an adjustable voltage to second and third means to obtain an adjustment in the delays in the first and second variable delay lines for a substantially simultaneous occurrence of the second logic level in the first and second signals and wherein the fourth means produces the adjustable voltage in response to the relative times in the production of the second logic level in the first and second signals in the second means and the third means.

7. In a combination as set forth in claim 6, including, a third variable delay line having common characteristics with the first and second variable delay lines, fifth means for adjusting the delay in the third variable delay line, and sixth means for introducing the adjustable voltage from the fourth means to the fifth means to obtain an adjustment in the delay in the third variable delay line in accordance with the adjustments in the delays in the first and second variable delay lines.

8. In a combination as set forth in claim 7, including, the second means including a first inverter, and the third means including a second inverter.

9. In a combination as set forth in claim 8 wherein the first inverter inverts the input signal and introduces the inverted input signal to the first variable delay line and wherein the second variable delay line delays the input signal and introduces the delayed input signal to the second inverter.

* * * * *